(12) United States Patent
Takatori (10) Patent No.: US 10,056,887 B2
(45) Date of Patent: Aug. 21, 2018

(54) APPARATUS AND METHOD FOR CONTROLLING A DELAY CIRCUIT

(71) Applicant: Futurewei Technologies, Inc., Plano, TX (US)

(72) Inventor: Hiroshi Takatori, Sacramento, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/260,146

(22) Filed: Sep. 8, 2016

(65) Prior Publication Data
US 2018/0069541 A1    Mar. 8, 2018

(51) Int. Cl.
| | |
|---|---|
| *H03H 11/26* | (2006.01) |
| *H03K 5/13* | (2014.01) |
| *H04L 1/20* | (2006.01) |
| *H03K 5/00* | (2006.01) |

(52) U.S. Cl.
CPC .................. *H03K 5/13* (2013.01); *H04L 1/20* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 5,513,214 A * | 4/1996 | Gozzo | ................. | H03H 21/0012 375/232 |
| 6,115,418 A * | 9/2000 | Raghavan | ......... | H04L 25/03038 375/233 |
| 6,876,699 B1 * | 4/2005 | Chadha | ............. | H04L 25/03057 370/419 |
| 7,075,363 B1 | 7/2006 | Thon | | |
| 7,421,022 B2 | 9/2008 | Choudhary et al. | | |
| 8,243,782 B2 * | 8/2012 | Mobin | .............. | H04L 25/03057 375/232 |
| 8,706,042 B2 | 4/2014 | Takatori | | |
| 8,731,040 B2 * | 5/2014 | Aziz | ................. | H04L 25/03057 375/233 |
| 8,929,429 B2 | 1/2015 | Takatori et al. | | |
| 9,065,644 B2 | 6/2015 | Takatori | | |
| 9,172,498 B2 | 10/2015 | Takatori et al. | | |
| 2004/0120394 A1 | 6/2004 | Miao et al. | | |

(Continued)

OTHER PUBLICATIONS

Takatori, U.S. Appl. No. 15/260,117, filed Sep. 8, 2016.

(Continued)

*Primary Examiner* — Lincoln Donovan
*Assistant Examiner* — Khareem E Almo
(74) *Attorney, Agent, or Firm* — Futurewei Technologies, Inc.

(57) ABSTRACT

An apparatus and method are provided for controlling a delay circuit. Included is a delay circuit configured to receive a probe signal. Further provided is a controller in electrical communication with the delay circuit. The controller is configured to perform various operations, in response to the receipt of the probe signal by the delay circuit. A positive peak and a negative peak of an output of the delay circuit are measured. Further, a ratio involving the positive peak and the negative peak of the output of the delay circuit is calculated. A delay of the delay circuit is controlled, based on the ratio.

17 Claims, 7 Drawing Sheets

(56) References Cited

U.S. PATENT DOCUMENTS

| | | | |
|---|---|---|---|
| 2006/0008279 A1* | 1/2006 | Chiang | H04B 10/6971 398/202 |
| 2011/0317752 A1* | 12/2011 | Born | H04L 25/0307 375/232 |
| 2012/0327818 A1 | 12/2012 | Takatori | |
| 2014/0086300 A1* | 3/2014 | Jameson | H04L 25/03057 375/233 |
| 2015/0085914 A1 | 3/2015 | Kizer et al. | |
| 2015/0249532 A1 | 9/2015 | Takatori | |

OTHER PUBLICATIONS

Bulzacchelli et al., "A 28-Gb/s 4-Tap FFE/15-Tap DFE Serial Link Transceiver in 32-nm SOI CMOS Technology," IEEE, vol. 47, No. 12, Dec. 2012, pp. 3232-3248.

Stephens, R., "Optimize equalization for FFE, CTLE, DFE, and crosstalk," EDN Network, Oct. 21, 2015, available at http://www.edn.com/electronics-blogs/eye-on-standards/4440609/Optimize-equalization-for-FFE—CTLE—DFE—and-crosstalk.

Telang, V., "Equalization for High-Speed Serdes: System-level Comprison of Analog and Digital Techniques," Broadcom Corporation, Aug. 2012, pp. 1-67.

Turker et al., "A 19Gb/s 38mW 1-Tap Speculative DFE Receiver in 90nm CMOS," VLSI Circuits, Jun. 2009, pp. 1-26.

Takatori et al., "100G Signaling Options over Backplane Classes," IEEE P802.3bj, Jan. 2012, pp. 1-10.

Mazzini et al., "C2M CDAUI-8: considerations and proposals on P802.3bs 400 Gb/s Ethernet draft," IEEE 802.3bs Task Force, Nov. 2015, pp. 1-17.

Takatori et al., "56G LR Margin over 40 inch CH," Optical Internetworking Forum, Oct. 2014, pp. 1-11.

* cited by examiner

APPARATUS AND METHOD FOR CONTROLLING A DELAY CIRCUIT

FIELD OF THE INVENTION

The present invention relates to communication systems, and more particularly to calibration of communication systems.

BACKGROUND

A massive data traffic increase has been witnessed recently in data centers which, in turn, has forced interconnect link-speeds from lower speeds (e.g. 10-28 Gbps, etc.) to significantly higher speeds (e.g. 56 Gbps and up, etc.). Based on such demand, a throughput of interconnects [e.g. serializer/deserializer (SerDes), etc.] has been increased by at least a factor of two, and possibly higher.

This, in turn, has resulted in a variety of technical issues. For example, the precision of various interconnect link components must be particularly increased. In the context of noise cancellation, for instance, delay circuits may serve to appropriately time a feedback of input signals for the purpose of noise cancellation, etc. In such context, a delay of such delay circuits must be increasingly accurate (in duration) so that proper noise cancellation may be afforded.

SUMMARY

An apparatus and method are provided for controlling a delay circuit. Included is a delay circuit configured to receive a probe signal. Further provided is a controller in electrical communication with the delay circuit. The controller is configured to perform various operations, in response to the receipt of the probe signal by the delay circuit. A positive peak and a negative peak of an output of the delay circuit are measured. Further, a ratio involving the positive peak and the negative peak of the output of the delay circuit is calculated. A delay of the delay circuit is controlled, based on the ratio.

In a first embodiment, the delay circuit may be a component of a feed forward equalizer (FFE).

In a second embodiment (which may or may not be combined with the first embodiment), the delay circuit may be a component of a serializer/deserializer (Ser/Des).

In a third embodiment (which may or may not be combined with the first and/or second embodiments), the delay circuit may be a first delay circuit that is in electrical communication with a plurality of delay circuits. Further, the plurality of delay circuits may be arranged in a serial configuration and the first delay circuit is first-in-line amongst the plurality of delay circuits in the serial configuration.

In a fourth embodiment (which may or may not be combined with the first, second, and/or third embodiments), it may be determined whether the delay of the delay circuit is acceptable.

In a fifth embodiment (which may or may not be combined with the first, second, third, and/or fourth embodiments), additional operations may be performed if it is not determined that the delay of the delay circuit is acceptable. For example, such additional operations may involve the repetition of the measurement of the positive peak of the output of the delay circuit, the measurement of the negative peak of the output of the delay circuit, the calculation of the ratio involving the positive peak and the negative peak of the output of the delay circuit, and the control of the delay of the delay circuit.

In a sixth embodiment (which may or may not be combined with the first, second, third, fourth, and/or fifth embodiments), the repetition may be performed multiple times.

In a seventh embodiment (which may or may not be combined with the first, second, third, fourth, fifth, and/or sixth embodiments), the repetition may be performed only once.

In an eighth embodiment (which may or may not be combined with the first, second, third, fourth, fifth, sixth, and/or seventh embodiments), the delay of the delay circuit may be controlled by selecting a pole of the delay circuit.

To this end, in some optional embodiments, one or more of the foregoing features of the aforementioned apparatus and/or method may ensure that a delay of a delay circuit (e.g. FFE delay circuit) is set accurately and/or in an accelerated manner. It should be noted that the aforementioned potential advantages are set forth for illustrative purposes only and should not be construed as limiting in any manner.

DETAILED DESCRIPTION

Delay circuits are often-used components of high speed communication systems. An example of such high speed communication systems includes a serializer/deserializer (SerDes), which may refer to any apparatus that includes at least two components, one for converting data from a serial form to a parallel form, and another one for converting data from a parallel form to a serial form. In use, such delay circuits may serve various purposes including, but not limited to appropriately timing a feedback of input signals for the purpose of noise cancellation, etc.

Before such delay circuits may be suitably used for these and/or other purposes, the delay circuit is calibrated for ensuring that any exhibited delay is of an appropriate duration. Various embodiments will now be described involving a delay circuit calibration technique that may be used during a set-up process, before actual use of the associated high speed communication system, to ensure that a delay of the delay circuit is properly set.

Figure 1:
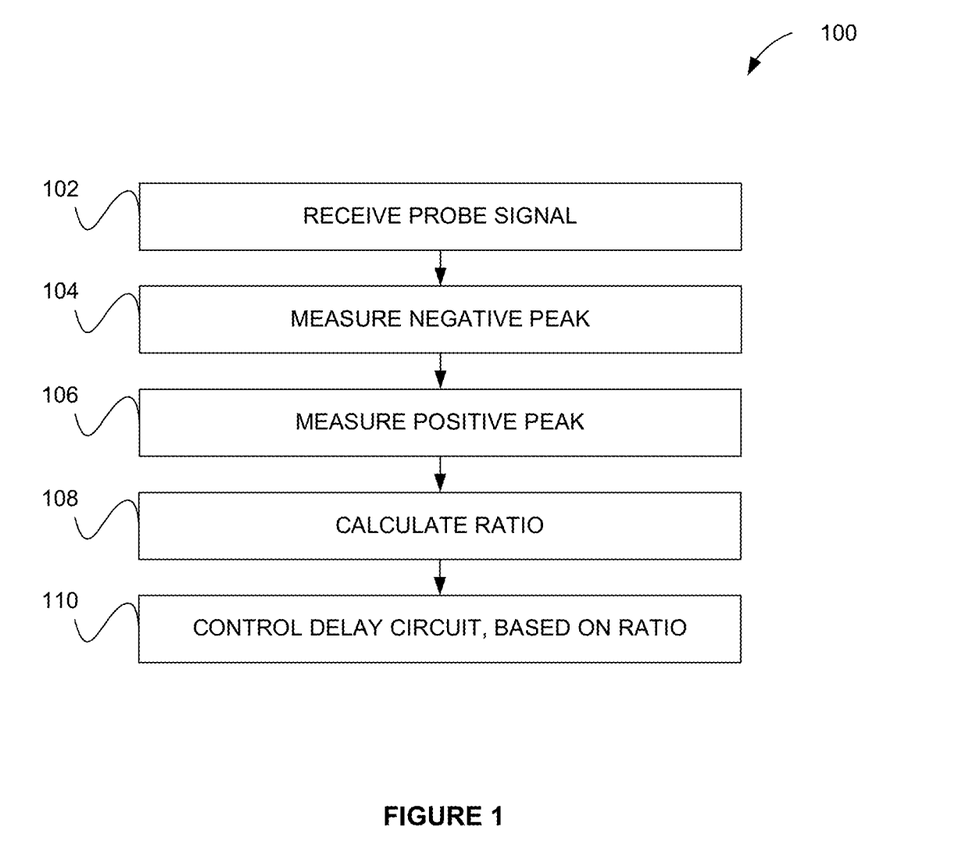
FIG. 1 illustrates a method for controlling a delay circuit, in accordance with one embodiment.

FIG. 1 illustrates a method 100 for controlling a delay circuit, in accordance with one embodiment. As shown, a probe signal is received at a delay circuit in operation 102. In the context of the present description, the probe signal may include any signal that is capable of being used to measure an output of a delay circuit. For example, in one embodiment, the probe signal may include one or more signal pulses that are initiated at a set-up of an apparatus before being shipped, for calibration purposes.

Further, the aforementioned delay circuit may include any circuit (or component thereof) that exhibits a delay between a receipt of a signal and an output that is caused by or results from such signal receipt. For example, in one embodiment, the delay circuit may include a linear equalizer or a component thereof. In another embodiment, the delay circuit may include a feed forward equalizer (FFE) or a component thereof. It should be noted that additional examples of delay circuits in the form of delay components will be set forth during the description of subsequent figures. It should also be noted that, in different embodiments, the delay circuit may or may not further engage in other processing (e.g. filtering, etc.) of a signal, in addition to the delay thereof.

In operations 104-106, an output signal of the delay circuit is measured. Specifically, such measurement includes measuring a positive peak (in operation 104) and a negative peak (in operation 106) of the output signal emitted from the delay circuit. In the context of the present description, the term output signal may refer to any signal of any delay circuit (or component thereof) that is down-path from a delay circuit input where the probe signal is received.

In operation 108, a ratio involving the aforementioned positive peak and negative peak is calculated. In the context of the present description, the positive and negative peaks may refer to voltage magnitudes at or near the respective peaks. In various embodiments, such magnitude values of the positive peak and negative peak (or other values derived therefrom) may be involved in the ratio in any desired manner. For example, the positive peak-related value may be used as a numerator of the ratio while the negative peak-related value may be used as a denominator of the ratio, or vice versa. As a further option, the ratio may be further refined using any factor and/or expression, as desired. As will be described later, through trial-and-error, simulation, and/or empirical evidence, the peak voltage magnitude values and, more particularly the ratio thereof, may be found to have a linear relationship with a delay exhibited by the delay circuit.

To this end, in operation 110, a delay of the delay circuit is controlled based on the ratio calculated in operation 108. In the present description, such control may involve any aspect of the delay circuit used to control an amount (e.g. duration, etc.) of the delay exhibited by the delay circuit. Further, in various embodiments, such delay may be between a receipt of a signal (e.g. probe signal, runtime signal, etc.) and an output of the delay circuit (or component thereof). To accomplish the aforementioned delay control in an embodiment where the delay is afforded via a low pass filter (LPF), a pole of the delay circuit may be selected based on the foregoing ratio, for example.

Specifically, in the present embodiment, there is a relationship between the foregoing ratio calculated in operation 108 and an associated delay which, in turn, can be accommodated/set by a respective desired LPF pole. To this end, a particular ratio may be known to deliver a desired pole setting for the delay circuit. In various embodiments, such relationship and/or the particular ratio (or ratio range) may be known through trial-and-error, empirical evidence, etc. A specific example of a possible desired ratio will be set forth later during the description of a subsequent embodiment (see FIG. 4).

By knowing the aforementioned relationship and/or particular desired ratio (or ratio range), such information may be used to accelerate the calibration process and/or make such calibration process more accurate. Further, the operations 102-108 may be repeated once (such that the operations 102 and 104 are conducted twice), or repeated multiple times in other embodiments, in order to refine the pole selection process. Thus, any mathematical technique may be used to leverage the foregoing relationship and/or the particular ratio (or ratio range) via a minimal number of measurements (e.g. two (2), etc.), for identifying an appropriate pole. To this end, a convergence process in connection with such pole selection may be accelerated and/or improved in some embodiments.

An example of such method 100 will now be set forth. During a first iteration, a pole of the delay circuit may be set to a first default value, X. Operations 102-108 may then be initiated to calculate a first ratio, A. Thereafter, the known pole-ratio relationship may be used to identify (via extrapolation) a second pole value, Y, based on a target second ratio, B. Further, such second pole value Y may be tested via another iteration of the method 100.

As yet another example, a pole of the delay circuit may be set to a first default value, X. Operations 102-108 may then be initiated to calculate a first ratio, A. Thereafter, the operations 102-108 may be repeated after setting the pole of the delay circuit to a second value, Y. Such second value Y may be another static default value or a dynamically generated value that is based on results of the first iteration. The second iteration of the operations 102-108 may thus produce a second ratio, B. With such ratios A, B, a final third pole value Z may be selected based on an interpolation involving the first/second ratios A, B and a known target ratio, C. It should be noted that the foregoing examples are set forth for illustrative purposes only as any use of the ratio information is contemplated for pole selection.

Therefore, in some optional embodiments, one or more of the foregoing features may ensure that a delay of a delay circuit (e.g. a FFE delay circuit) is both accurately and effectively set during a convergence process for any desired purpose. For example, in one possible embodiment, one or more of the techniques disclosed herein may be used for controlling a delay of a delay circuit, to precisely time an output such that a first intersymbol interference need not necessarily be suppressed. Thus, power may be saved by avoiding such suppression. More information regarding one technique for reducing an effect of intersymbol interference in such a manner in accordance with one possible embodiment may be found with reference to an application filed coincidently herewith Ser. No. 15/260,117 and entitled "APPARATUS, SYSTEM, AND METHOD FOR REDUCING A NUMBER OF INTERSYMBOL INTERFERENCE COMPONENTS TO BE SUPPRESSED," which is incorporated herein by reference in its entirety for all purposes (hereinafter "Referenced Application").

More illustrative information will now be set forth regarding various optional architectures and uses in which the foregoing method may or may not be implemented, per the desires of the user. It should be noted that the following information is set forth for illustrative purposes and should not be construed as limiting in any manner. Any of the following features may be optionally incorporated with or without other features described.

Figure 2:
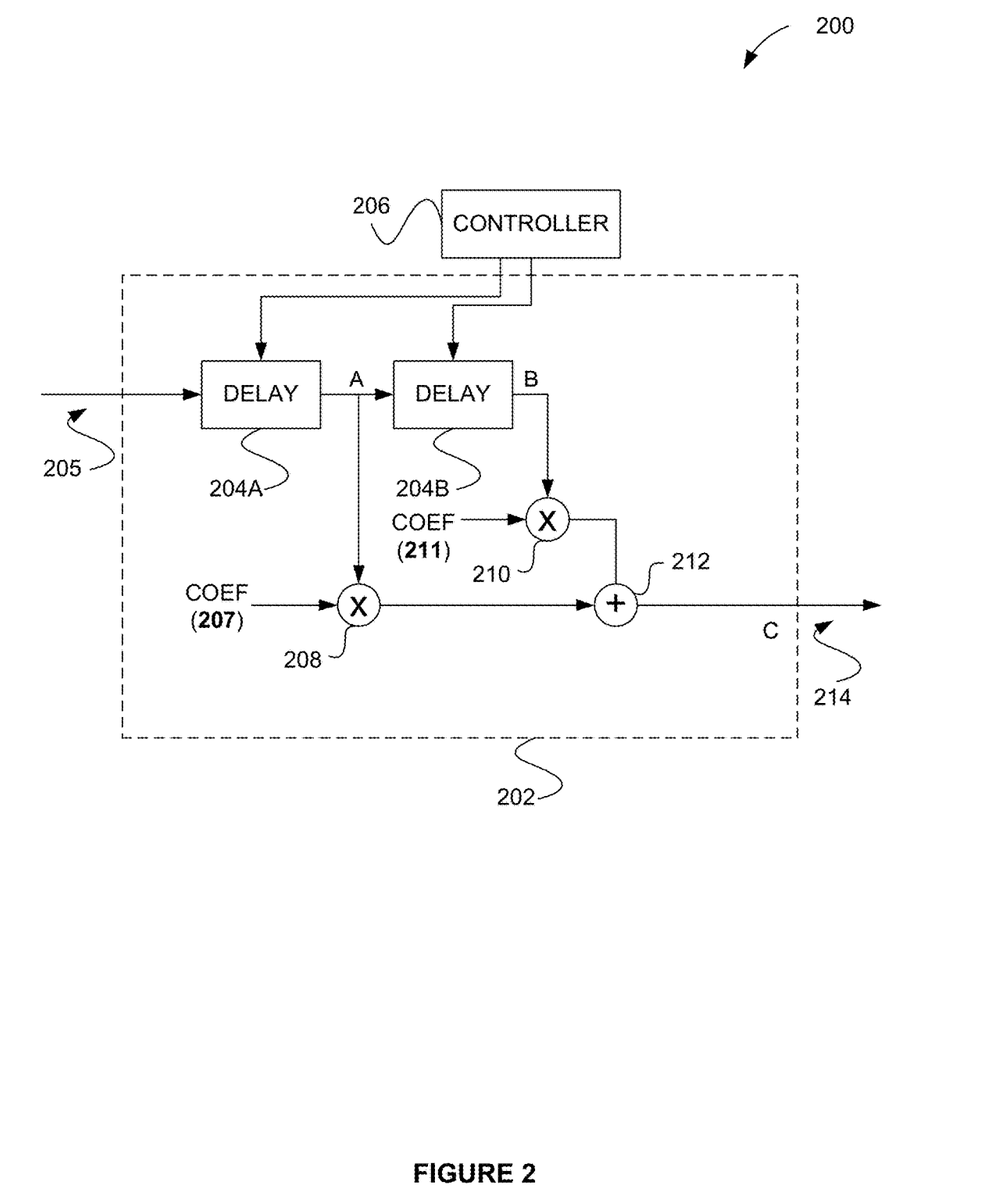
FIG. 2 illustrates an apparatus including a delay circuit configured to be controlled, in accordance with one embodiment.

FIG. 2 illustrates an apparatus 200 including a delay circuit 202 configured to be controlled, in accordance with one embodiment. As an option, the apparatus 200 may be implemented in the context of any one or more of the embodiments set forth in any previous and/or subsequent figure(s) and/or description thereof. For example, the apparatus 200 may operate in accordance with the method 100 of FIG. 1. However, it is to be appreciated that the apparatus 200 may be implemented in the context of any desired environment.

The delay circuit 202 includes a plurality of delay components 204A, 204B that are arranged in electrical communication in a serial configuration, in the manner shown. In one embodiment, the delay circuit 202 may take the form of an FFE. In operation, an input 205 of the delay circuit 202 may be adapted to receive an input signal (e.g. probe signal, runtime signal, etc.). As further shown, a network of multipliers 208, 210 are in electrical communication with outputs of the delay components 204A, 204B so as to control a magnitude thereof (by setting corresponding coefficients 207, 211), before generating the ultimate output 214 of the delay circuit 202 via an adder 212 that is ultimately fed to downstream components such as a decision feedback equalizer (DFE).

In use, a first one of the coefficients 207 and a second one of the coefficients 211 may be set as a function of expected signaling characteristics (e.g. magnitudes, etc.) of a particular communication protocol (e.g. PAM3/PAM4, etc.). For example, in one embodiment designed to accommodate a PAM4 protocol, the first coefficient 207 may be set to one (1) and the second coefficient 211 may be set to 0.3. Further, while only one ultimate output 214 is shown in FIG. 2, it should be noted that any downstream components (e.g. a DFE, etc.) may tap any of the various points A, B, C depending on the specific purpose/type of downstream processing. For example, more information regarding one specific way in which various tap points may be desired for use in reducing an effect of intersymbol interference may be found in the Referenced Application.

As further shown, the delay components 204A, 204B of the delay circuit 202 are further in electrical communication with a controller 206. Such controller 206 may include any circuit that is capable of repeatedly measuring any aspect (e.g. negative/positive peaks, etc.) of an output of the delay components 204A, 204B, and further controlling a length of delay exhibited by the delay components 204A, 204B. An example of the delay circuit 202 will now be described.

Figure 3:
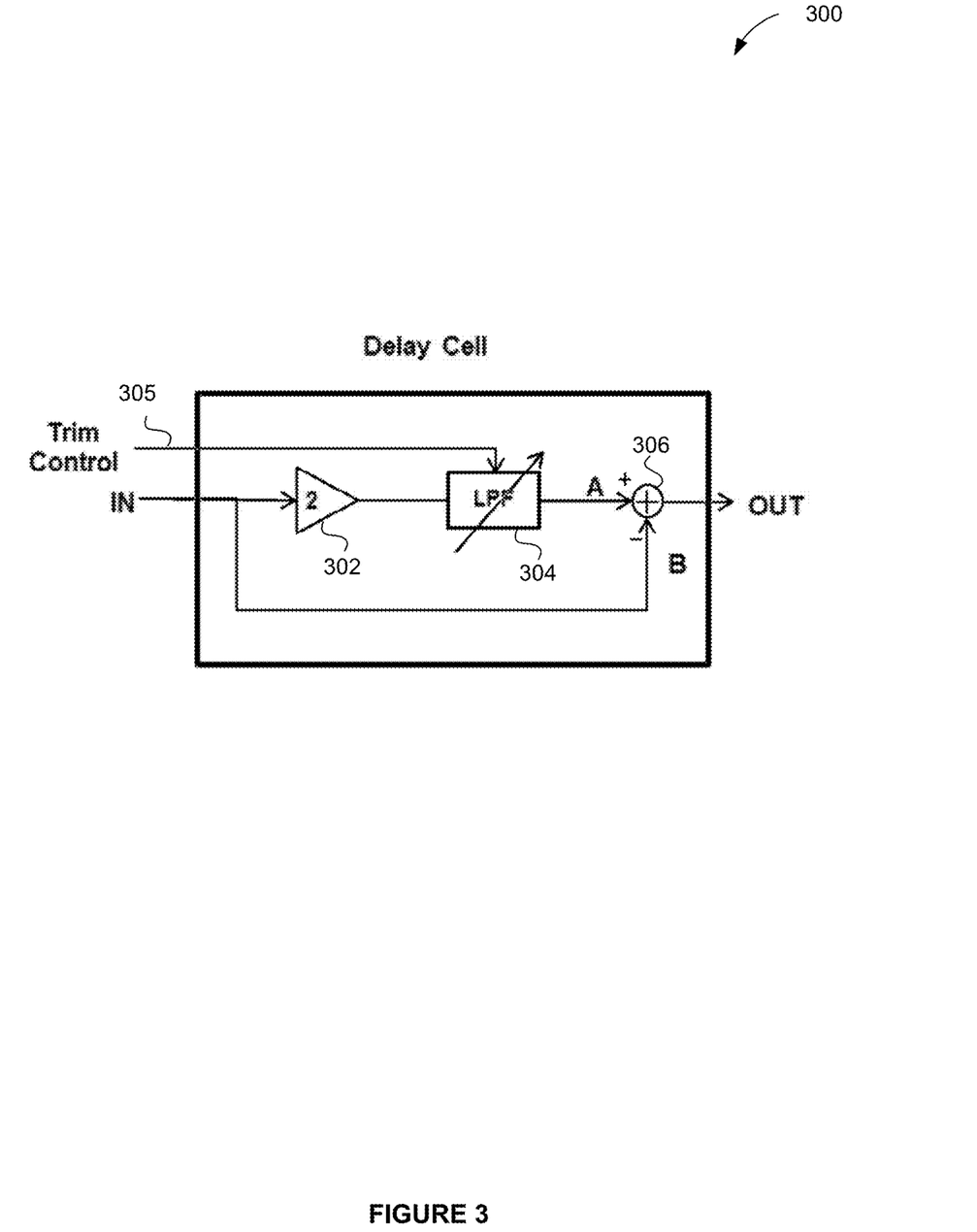
FIG. 3 illustrates a delay component configured to be controlled, in accordance with one embodiment.

FIG. 3 illustrates a delay component 300 configured to be controlled, in accordance with one embodiment. As an option, the delay component 300 may be implemented in the context of any one or more of the embodiments set forth in any previous and/or subsequent figure(s) and/or description thereof. For example, the delay component 300 may be implemented in the context of one or more of the delay components 204A, 204B of FIG. 2. However, it is to be appreciated that the delay component 300 may be implemented in the context of any desired environment.

As shown, the delay component 300 includes an amplifier 302 in electrical communication with a variable delay LPF 304 which, in turn, is in electrical communication with an adder 306 (that is also in electrical communication with an input of the delay component 300). In use, the amplifier 302 serves to amplify an input signal of the delay component 300 before feeding the same to the LPF 304. The LPF 304, in turn, serves to perform some filtering on the amplified input signal.

Further, the LPF 304 is capable of being controlled by a controller (e.g. controller 206 of FIG. 2, etc.) which, while not shown in the current figure, may also measure an output of the delay component 300. Specifically, the filtering (as well as an inherent delay in such filtering) may be controlled via a trim control line 305 that selects a pole of the delay component 300 (and, in particular, of the LPF 304), in the manner shown, based on measurements at the output of the delay component 300. Still yet, an output of the LPF 304 may be added to the input signal of the delay component 300 via the adder 306. More information will now be set forth regarding one specific method that may be possibly used to control the LPF 304 in the forgoing manner.

Figure 4:
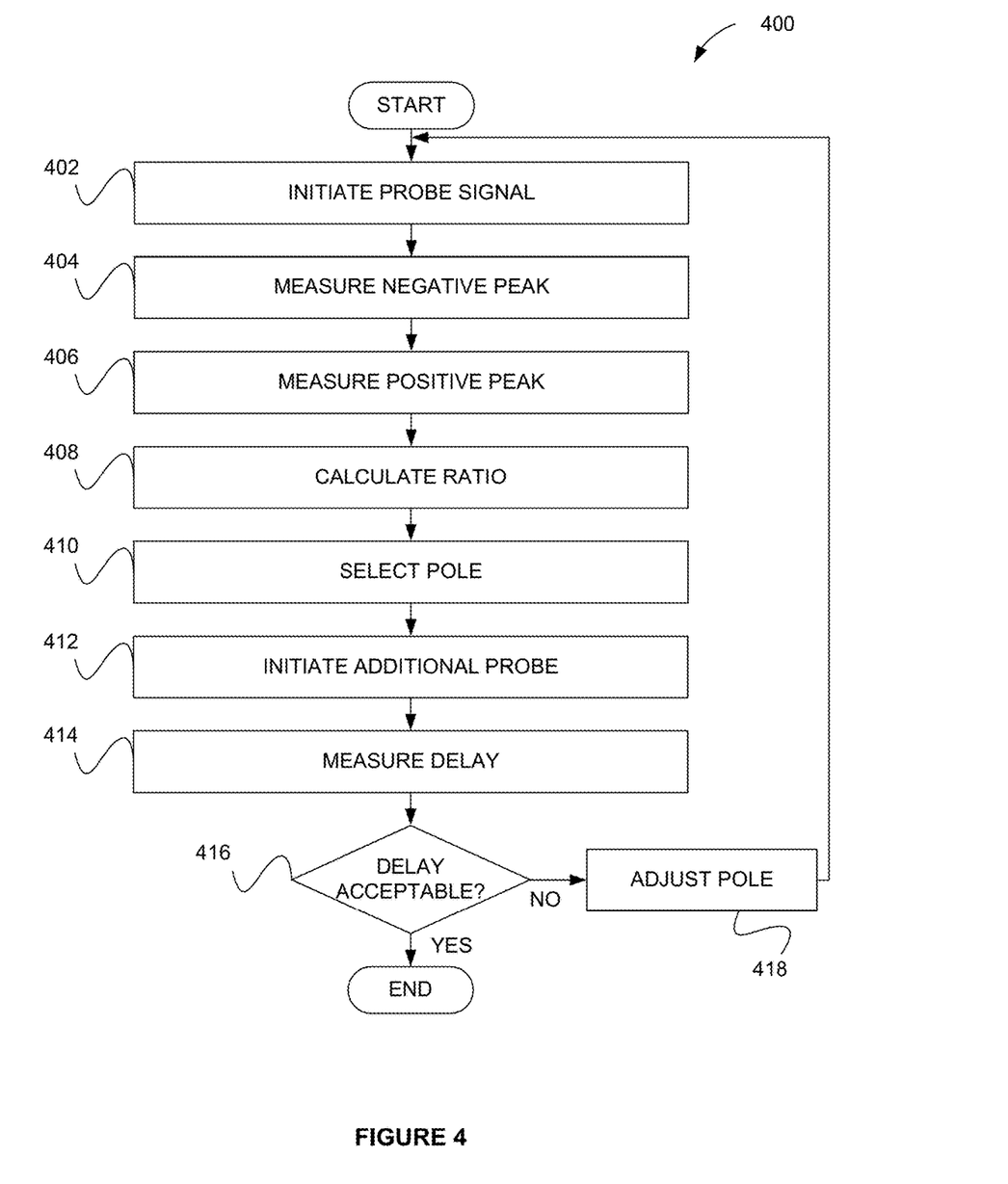
FIG. 4 illustrates a method for controlling a delay circuit, in accordance with one embodiment.

FIG. 4 illustrates a method 400 for controlling a delay circuit, in accordance with one embodiment. As an option, the method 400 may be implemented in the context of any one or more of the embodiments set forth in any previous and/or subsequent figure(s) and/or description thereof. For example, the method 400 may be implemented by a controller (e.g. the controller 206 of FIG. 2, etc.) for carrying out the method 100 of FIG. 1, in one particular manner. However, it is to be appreciated that the method 400 may be implemented in the context of any desired environment.

As shown, a probe signal is initiated in operation 402. In one possible embodiment, the initiation of such probe signal may be caused or controlled by a controller (e.g. the controller 206 of FIG. 2, etc.). Next, the controller measures a level of negative and positive peaks of an output signal of a delay component. See operations 404-406. For example, in one embodiment, the measurements may be taken at an output of a first delay circuit (e.g. component) that is in electrical communication with a plurality of delay circuits (e.g. components) that are arranged in a serial configuration, where the first delay circuit is first-in-line amongst the plurality of delay circuits in the serial configuration (e.g. the first delay component 204A of FIG. 2, etc.).

Based on the measurements of operations 404-406, a ratio is calculated in operation 408. Specifically, in one possible embodiment, such ratio may be one where a numerator is the aforementioned positive peak level and a denominator is the aforementioned negative peak level, or vice versa. Based on such ratio, a pole of the delay component may be selected to control a delay exhibited by such delay component, per operation 410. As mentioned earlier, there may be a linear relationship between the foregoing ratio and a respective pole, to facilitate the pole selection of operation 410. Specifically, during a first iteration of operations 402-408, a default first pole may be used. In one embodiment, such first default pole may be predetermined, based on previously-observed empirical evidence.

In additional embodiments, other relationships (e.g. non-linear, etc.) are contemplated, as well. Further, in various embodiments, a look-up table (stored on a computer readable medium), decision logic, and/or any other desired mechanism may be employed for selecting the appropriate pole, based on the ratio.

With continuing reference to FIG. 4, another probe signal is initiated (in operation 412) so that the delay exhibited by the delay component may be measured (in operation 414). To this end, it may be determined whether the delay is acceptable in decision 416. It should be noted that the criteria by which decision 416 is made may vary based on an ultimate purpose of the delay. For example, if the delay is used for noise suppression, such delay may be configured to appropriately time any cancelation signal that is fed back and applied to an input signal. As yet another example in accordance with one very specific possible embodiment, the delay may be used to precisely time an output such that a first intersymbol interference need not necessarily be suppressed. As mentioned earlier, more information regarding such technique for reducing an effect of intersymbol interference in such a manner in accordance with one possible embodiment may be found in the Referenced Application.

For example, in one specific possible embodiment, a 7-15% ratio range may be known (e.g. through trial-and-error, etc.) to be desired as delivering a desired pole setting for the delay component, based on the aforementioned linear relationship. Further, it may be assumed that there is a direct correlation between the delay and the ratio, thus allowing for the use of a measurement of the ratio as a mechanism for measuring delay. Also in the present embodiment, the ratio may be one where a numerator is the aforementioned negative peak level and a denominator is the aforementioned positive peak level. To this end, at decision 416, it may be determined whether the ratio is greater than 0.15 and/or lower than 0.075 in accordance with the aforementioned ratio range.

Thus, if the ratio is greater than 0.15, the pole may be adjusted in operation 418 by incrementally increasing a trim control (e.g. trim control line 305 of FIG. 3) to incrementally increase delay. Conversely, if the ratio is less than 0.075, the pole may be adjusted in operation 418 by incrementally decreasing the trim control to incrementally decrease delay. In either case, the operations 402-414 may be repeated, until an appropriate delay is measured in operation 414. With that said, once the delay is deemed acceptable per decision 416 (i.e. the ratio is properly set within the acceptable range), the method 400 ends.

Thus, a particular ratio, e.g. 10% (or ratio range, e.g. 7-15%) may be known (e.g. through trial-and-error, etc.) to be desired as delivering a desired pole setting for the delay component, based on the aforementioned linear relationship. While a specific method has been set forth above during the description of FIG. 4, interpolation or other techniques may be used in additional embodiments, in connection with a minimal number of measurements (e.g. two (2), etc.) for identifying an appropriate pole. In any case, by utilizing such particular ratio in connection with pole selection, a convergence process in connection with such pole selection may be accelerated and improved (and even possibly guaranteed) in some embodiments.

Figure 5:
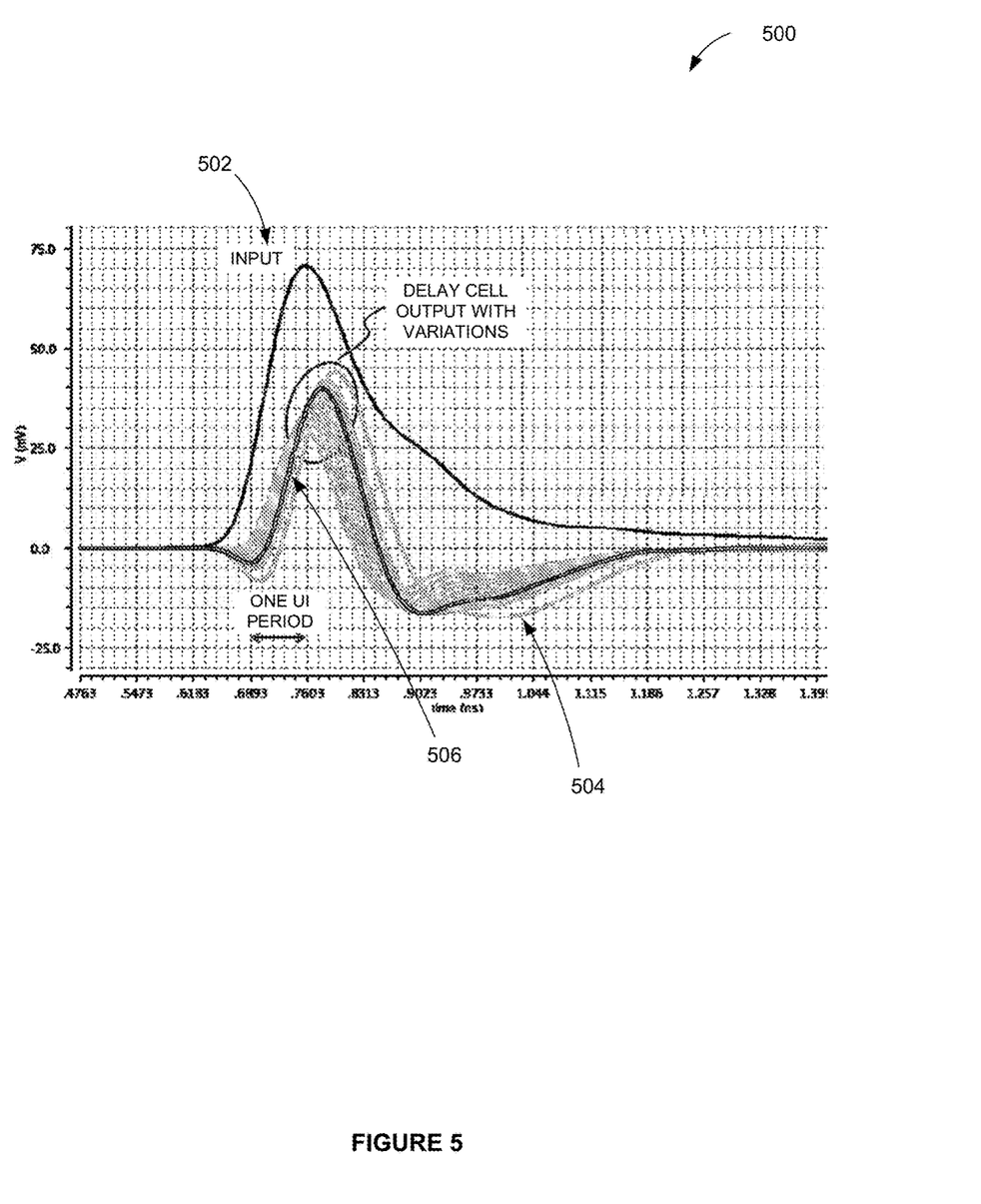
FIG. 5 illustrates a plot showing variations in an output signal of the delay component, based on different iterations of the operations 402-414 of the method of FIG. 4.

FIG. 5 illustrates a plot 500 showing variations in an output signal of the delay component, based on different iterations of the operations 402-414 of the method 400 of FIG. 4. Specifically, based on a constant probe signal input 502, the delay component output signals 504 may vary based on an adjustment of the poles (as a function of the calculated ratio). Further, a specific output signal 506 (and an associated pole selection) may be arrived upon in an accurate and effective/efficient manner through the use of the aforementioned negative/positive peak ratio.

Figure 6:
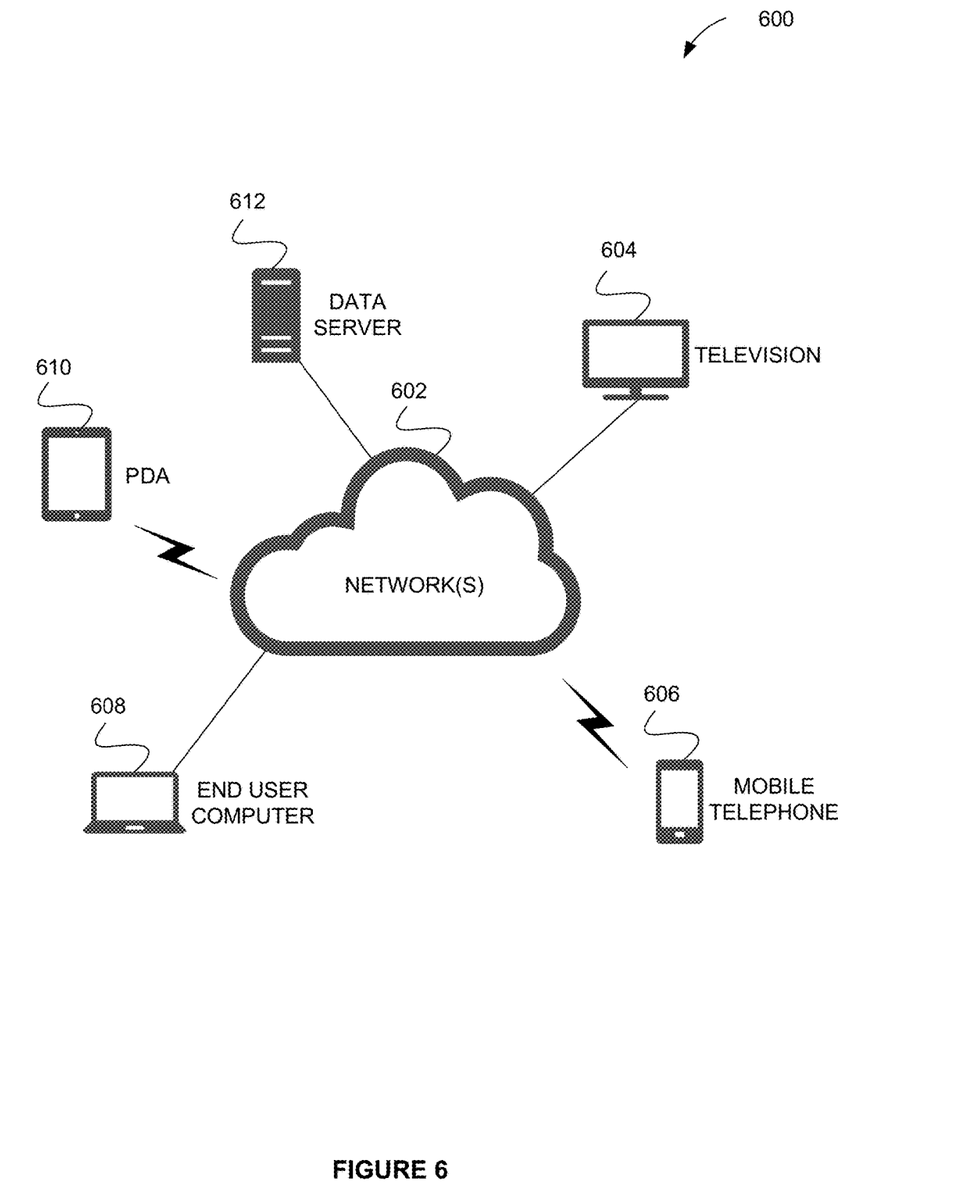
FIG. 6 illustrates a network architecture, in accordance with one embodiment.

FIG. 6 illustrates a network architecture 600, in accordance with one embodiment. As shown, at least one network 602 is provided. In various embodiments, any one or more components/features set forth during the description of any previous figure(s) may be implemented in connection with any one or more of the components of the at least one network 602.

In the context of the present network architecture 600, the network 602 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 602 may be provided.

Coupled to the network 602 is a plurality of devices. For example, a server computer 612 and an end user computer 608 may be coupled to the network 602 for communication purposes. Such end user computer 608 may include a desktop computer, lap-top computer, and/or any other type of logic. Still yet, various other devices may be coupled to the network 602 including a personal digital assistant (PDA) device 610, a mobile phone device 606, a television 604, etc.

Figure 7:
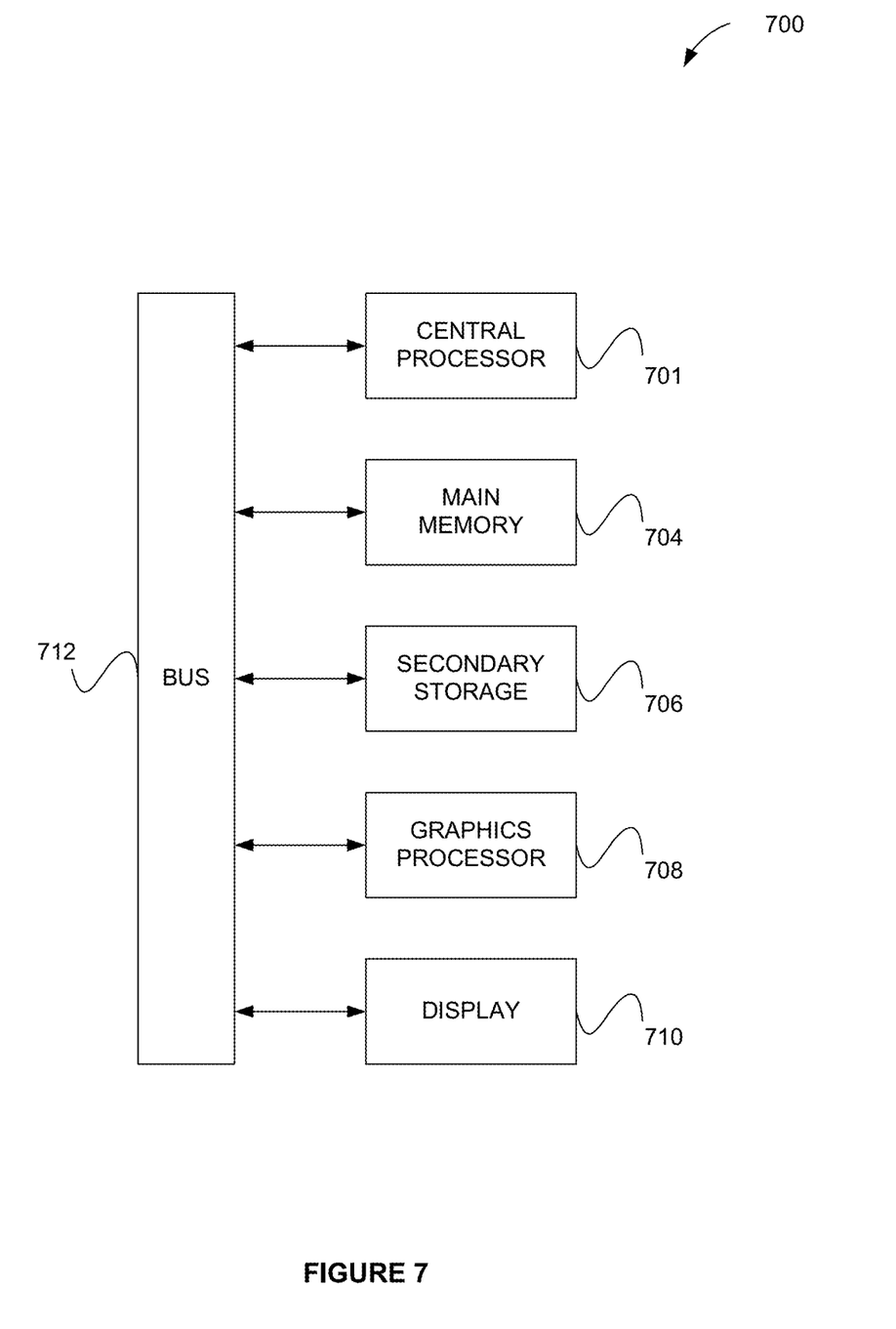
FIG. 7 illustrates an exemplary system, in accordance with one embodiment.

FIG. 7 illustrates an exemplary system 700, in accordance with one embodiment. As an option, the system 700 may be implemented in the context of any of the devices of the network architecture 600 of FIG. 6. However, it is to be appreciated that the system 700 may be implemented in any desired environment.

As shown, a system 700 is provided including at least one central processor 702 which is connected to a bus 712. The system 700 also includes main memory 704 [e.g., hard disk drive, solid state drive, random access memory (RAM), etc.]. The system 700 also includes a graphics processor 708 and a display 710.

The system 700 may also include a secondary storage 706. The secondary storage 706 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 704, the secondary storage 706, and/or any other memory, for that matter. Such computer programs, when executed, enable the system 700 to perform various functions (as set forth above, for example). Memory 704, secondary storage 706 and/or any other storage are possible examples of non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
   a delay circuit that is a component of a serializer/deserializer and that is configured to receive a probe signal; and
   a controller in electrical communication with the delay circuit, the controller configured to, in response to the receipt of the probe signal by the delay circuit:
   measure a positive peak of an output of the delay circuit;
   measure a negative peak of the output of the delay circuit;
   calculate a ratio involving the positive peak and the negative peak of the output of the delay circuit; and
   control a delay of the delay circuit, based on the ratio.

2. The apparatus of claim 1, wherein the delay circuit is a component of a feed forward equalizer.

3. The apparatus of claim 1, wherein the delay circuit is a first delay circuit that is in electrical communication with a plurality of delay circuits.

4. The apparatus of claim 3, wherein the plurality of delay circuits are arranged in a serial configuration and the first delay circuit is first-in-line amongst the plurality of delay circuits in the serial configuration.

5. The apparatus of claim 1, wherein the delay of the delay circuit is controlled by selecting a pole of the delay circuit.

6. The apparatus of claim 1, wherein the controller is further configured to determine whether the delay of the delay circuit is acceptable.

7. The apparatus of claim 6, wherein the controller is further configured to repeat: the measurement of the positive peak of the output of the delay circuit, the measurement of the negative peak of the output of the delay circuit, the calculation of the ratio involving the positive peak and the negative peak of the output of the delay circuit, and the control of the delay of the delay circuit; if it is not determined that the delay of the delay circuit is acceptable.

8. A system, comprising:
a serializer/deserializer including a delay circuit, the serializer/deserializer configured to:
 receive a probe signal at an input of the delay circuit;
 measure a positive peak of an output of the delay circuit;
 measure a negative peak of the output of the delay circuit;
 calculate a ratio involving the positive peak and the negative peak of the output of the delay circuit; and
 control a delay of the delay circuit, based on the ratio.

9. A method, comprising:
receiving a probe signal at an input of a delay circuit that is a component of a serializer/deserializer;
measuring a positive peak of an output of the delay circuit;
measuring a negative peak of the output of the delay circuit;
calculating a ratio involving the positive peak and the negative peak of the output of the delay circuit; and
controlling a delay of the delay circuit, based on the ratio.

10. The method of claim 9, wherein the delay circuit is a component of a feed forward equalizer.

11. The method of claim 9, wherein the delay circuit is a first delay circuit that is in electrical communication with a plurality of delay circuits.

12. The method of claim 11, wherein the plurality of delay circuits are arranged in a serial configuration and the first delay circuit is first-in-line amongst the plurality of delay circuits in the serial configuration.

13. The method of claim 9, and further comprising determining whether the delay of the delay circuit is acceptable.

14. The method of claim 13, and further comprising: repeating the measurement of the positive peak of the output of the delay circuit, the measurement of the negative peak of the output of the delay circuit, the calculation of the ratio involving the positive peak and the negative peak of the output of the delay circuit, and the control of the delay of the delay circuit; if it is not determined that the delay of the delay circuit is acceptable.

15. The method of claim 14, wherein the repeating is performed only once.

16. The method of claim 14, wherein the repeating is performed multiple times.

17. The method of claim 9, wherein the delay of the delay circuit is controlled by selecting a pole of the delay circuit.

* * * * *